United States Patent [19]

Frey

[11] 4,354,182
[45] Oct. 12, 1982

[54] MONITORING EQUIPMENT FOR THE ELECTRICAL SUPPLY SYSTEM IN A MOTOR VEHICLE

[75] Inventor: Wunibald Frey, Schwieberdingen, Fed. Rep. of Germany

[73] Assignee: Robert Bosch GmbH, Stuttgart, Fed. Rep. of Germany

[21] Appl. No.: 158,227

[22] Filed: Jun. 10, 1980

[30] Foreign Application Priority Data

Jul. 2, 1979 [DE] Fed. Rep. of Germany ....... 2926705

[51] Int. Cl.³ .............................................. G08B 19/00
[52] U.S. Cl. ..................................... 340/650; 340/80; 340/635; 340/652; 340/653; 322/99
[58] Field of Search ............... 340/52 F, 80, 650, 652, 340/653, 654, 659, 691, 635; 322/28, 99

[56] References Cited

U.S. PATENT DOCUMENTS

| | | | |
|---|---|---|---|
| 3,944,905 | 3/1976 | Allport et al. | 322/99 |
| 4,019,120 | 4/1977 | Fattic | 322/99 |
| 4,240,023 | 12/1980 | Masutani | 322/99 |

*Primary Examiner*—Alvin H. Waring
*Attorney, Agent, or Firm*—Frishauf, Holtz, Woodward, Goodman

[57] ABSTRACT

Faulty excitation of the generator-regulator unit in the electrical system of a motor vehicle with resultant changes in the regulator output is indicated by the lighting of a light-emitting diode connected between the ignition switch and a Zener diode furnishing a constant reference voltage. A voltage divider is connected from the ignition switch to the negative battery terminal. One voltage divider tap is connected to the regulator input. When the regulator is underexcited, the voltage drop across the LED is sufficient to cause it to light. Alternatively, a first LED can be provided for indicating underexcitation of the generator and a second one for indicating overexcitation. For this purpose, the first LED is connected between the ignition switch and the regulator input terminal, while the second one is connected between the Zener diode and the regulator input terminal. Alternatively, the Zener diode in series with the second LED can be connected between the ignition switch and the negative battery terminal, while the first LED is connected between the ignition switch and the regulator input.

12 Claims, 4 Drawing Figures

MONITORING EQUIPMENT FOR THE ELECTRICAL SUPPLY SYSTEM IN A MOTOR VEHICLE

The present invention relates to the electrical system in motor vehicles.

BACKGROUND AND PRIOR ART

In known apparatus for monitoring the correct operation of the alternator and the associated regulator in a motor vehicle or other mobile unit, a control lamp is provided which is connected between the B+ bus of the electrical supply system to which the positive terminal of the battery is also connected and the regulator input which is connected to the common connection of the exciter diodes. The control lamp will be lit if the ignition switch is closed when the automobile is stationary and there is therefore no generator output, since in that case the positive side of the battery is connected to one side of the lamp while the negative side of the battery is connected through the field winding and the regulator to the D− terminal.

In some known systems, a thermal voltmeter is connected between the B+/D− terminals.

In other known systems, an ammeter is connected between the positive side of the battery and the positive bus of the vehicle, although bypassing the starter terminal, so that lack of proper operation of the generator or regulator is indicator by a constant discharge current. Usually, the regulator input to which the exciter diodes are connected has the designation D+; the regulator output connected to the field or exciter winding of the generator is denoted by DF; the positive and negative terminals of the supply system are designated by B+ and B−, respectively, the regulator terminal D− corresponding to the B− terminal of the supply. These designations will be used throughout this specification.

It is a disadvantage of the above-described apparatus that certain malfunctions, for example a short circuit or an open circuit in the main transistor in the regulator cannot be recognized. Other malfunctions such as a short circuit or a break in the rectifier diodes, which can later lead to a complete malfunction of the generator can also not be recognized since the control lamps are not sufficiently sensitive. The control lamp will, for example, not react to a short circuit in the main regulator transistor at all, even though in this case a very substantial increase in the supply voltage with resultant overheating of the battery can result. Further, the control lamp requires a particular operating voltage and operating current.

THE INVENTION

It is an object of the present invention to provide an indicator in which malfunction in the electrical supply of a motor vehicle can be recognized by a single circuit. The circuit is further to have a short response time, a robust, small construction, a long life and is to require only a low operating voltage and current. Further, the circuit for monitoring for short circuit or open circuit in the main transistor of the regulator should also be usable for monitoring for open and short circuits in the diodes of the generator. The indication should preferably be furnished by light-emitting diodes (LED), possibly in different colors or, alternatively, an incandescent lamp.

The basic idea of the present invention is to provide a voltage divider and an associated constant voltage furnishing element, as for example a Zener diode, for connection with an indicator such as a light-emitting diode so that the light-emitting diode serves as an indicator for malfunction.

Figure 1:
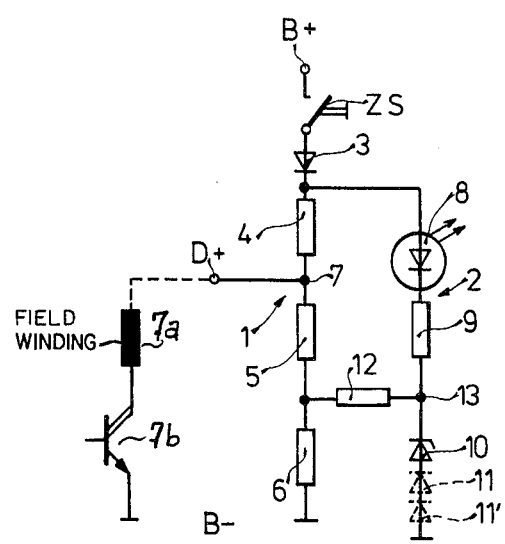
FIG. 1 is a schematic diagram of a first embodiment of the present invention utilizing a single light-emitting diode.

As shown in FIG. 1, the circuit according to the present invention includes a first branch which forms the voltage divider and a second branch. Branches 1 and 2 are connected in parallel, the common point of the branches being connected either directly, or through a diode 3, to one side of an ignition switch ZS, the other side of which is connected to the B+ terminal. Diode 3 prevents damage from voltages applied with a wrong polarity and prevents current flow in the reverse direction. The other terminal of branches 1 and 2 is connected to B−.

The first branch includes three resistors connected in series, namely resistors 4, 5, and 6. The common point 7 of resistors 4 and 5 is connected to D+, i.e. the regulator input. The field winding if designated by 7a and the main regulator transistor by 7b. The second branch includes a light emitting diode 8, a resistor 9 connected in series with the light-emitting diode and a constant voltage source, namely a Zener diode 10. Further diodes 11, 11', etc. may be connected in series with the Zener diode in order to generate a desired temperature characteristic, that is for matching the temperature characteristic of the regulator.

A resistor 12 is connected between the common point 13 of resistor 9 and Zener diode 10 and the common point of resistors 6 and 5. Changes in voltage applied to the first branch, i.e. changes in voltage at the supply bus are therefore also transferred to the second branch.

OPERATION

Let it first be assumed that the vehicle is standing still. There is thus no generator output voltage. If now the ignition siwtch ZS is closed, sufficient current will flow through resistors 4 and 5 (as determined by the B+ voltage, the constant voltage at circuit point 13 and the value of the resistors) tat the voltage across LED 8 is sufficient to cause it to emit light. Lighting of LED 8 for a closed ignition switch and a stationary vehicle corresponds to the lighting of the conventional control lamp under the same circumstances.

As soon as the internal combustion engine is started by the starter and the alternator is being driven, a voltage appears at terminal D+ which is connected either to the common point of separately connected exciter diodes or to the positive side of the generator output. The voltage is a positive potential of approximately 14 volts, so that both sides of resistor 4 have approximately the same potential applied thereto and therefore no current flows. The resistance of resistor 5 is not large enough that the voltage drop across it can cause lighting of LED 8. LED 8 is therefore de-energized. This is indicative of normal functioning of the electrical apparatus.

Two different types of malfunctions can now occur which will be indicated by lighting of LED 8. The first is a malfunction which results in a substantial rise of the voltage at terminal D+. This can be caused either by a short circuit of the main transistor in the transistor regulator, since this causes a current exceeding the full exciter current to be applied to the field winding. The excessive current through the field winding then causes an excessive rise in the voltage induced in the stator windings. The rise in voltage at terminal D+ causes the voltage drop across resistor 5 to become sufficiently large to cause LED 8 to light. This lighting due to excess generator output voltage is particularly desirable, since this type of malfunction would normally not come to the attention of the driver since all loads are being adequately supplied and the battery, at least at first, seems particularly well charged.

The second type of malfunction may be caused by an open circuit in the main transistor or by open circuits in the diodes associated with the generator. This causes the voltage at terminal D+ to decrease, possibly to zero. This corresponds to the condition at the time the ignition switch is first closed prior to the start of the engine. The cathode of diode 3 is still connected to the positive side of the battery through the starter switch and therefore the voltage drop across resistors 4 and 5 will be sufficient to cause LED 8 to light. Zener diode 10 causes a fixed reference potential to be applied to one side of LED 8 so that voltage variations in the circuit will be applied to its other terminal only, causing it to remain sensitive to such voltage variations throughout.

Figure 2:
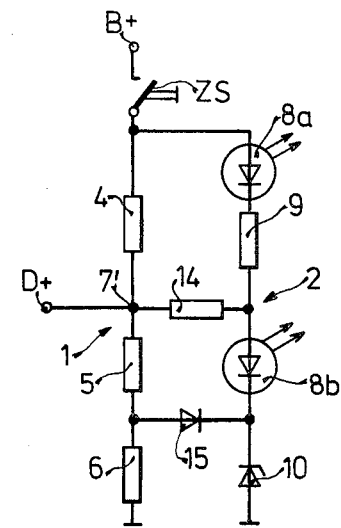
FIG. 2 is a second embodiment of the present invention utilizing two light-emitting diodes.
Figure 3:
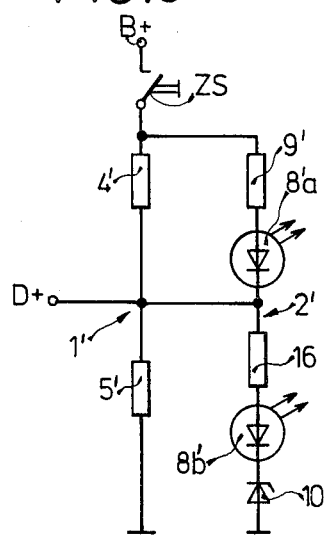
FIG. 3 is a schematic diagram of a third embodiment of the present invention for furnishing an indication of overvoltage at the D+ terminal.
Figure 4:
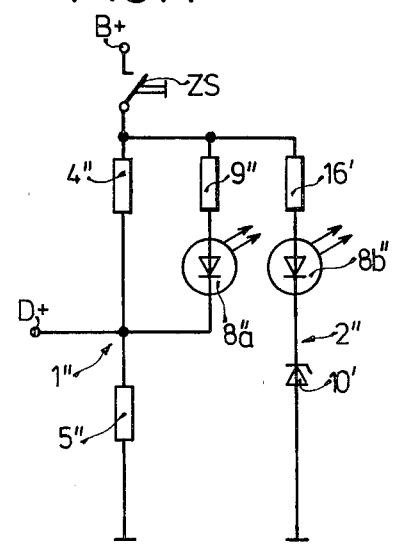
FIG. 4 is a schematic diagram of an embodiment of the present invention for sensing overvoltages at the B+ terminal.

About the same results can be achieved with the embodiments shown in FIGS. 2, 3 and 4, the difference being that in the latter embodiments two indicator units are used, which are operated selectively. Preferably, the indicator units are again light emitting diodes.

The circuit of FIG. 2 is constructed as follows: a voltage divider 2 is, as in FIG. 1, connected in parallel with a voltage divider 1. Here, as in all other embodiments, resistor 4 is not only part of the voltage divider, but is also a part of the exciter circuit. Voltage divider 1 again consists of resistors 4, 5 and 6. Connected in parallel with this is the second voltage divider, consisting of an LED 8a, a resistor 9, and a second LED 8b, a Zener diode 10 being connected to the cathode of LED 8b. Lighting of LED 8a is to indicate excessively low voltages, while lighting of LED 8b is to indicate overvoltage conditions. A resistor 14 is connected between terminal D+ (7') and the common point of resistor 9 and LED 8b. Resistor 14 limits the current through LED 8a and 8b if the generator is overexcited.

A diode 15 has an anode connected to the common point of resistors 5 and 6 and a cathode connected to the cathode of Zener diode 10. It decouples LED 8b from resistor 6.

The circuits of FIGS. 3 and 4, which will be discussed in greater detail below, are simplified versions of the circuit of FIG. 2. In FIG. 3, a voltge divider 1' consisting of resistors 4' and 5' is connected between ignition switch $Z_s$ and chassis potential. Connected in parallel with resistor 4' is a series circuit consisting of a resistor 9' and LED 8'a. The common point of resistor 4' and resistor 5' is connected to terminal D+. A resistor 16 connected in series with LED 8b' and Zener diode 10 is connected in parallel with resistor 5'.

In FIG. 4, a resistor 9" and an LED 8a" are again connected in parallel with resistor 4". However, a circuit including a resistor 16', an LED 8b" and a Zener diode 10' are connected in parallel with the series combination of resistors 4" and 5".

OPERATION

The operation of the above-described circuits under conditions of generator overvoltage will first be discussed. In FIG. 2, overexcitation of the generator, for example because of malfunction of the regulator, causes the voltage at terminals D+ and B+ to rise. The voltage at the common point of resistors 5 and 6 is held constant by Zener diode 10. Due to the difference between the Zener voltage and the excessive voltage at terminal 7', LED 8b lights, the current through the LED 8b being limited by resistor 14.

A break in the exciter circuit also causes interruption of voltage at terminal D+ of the generator. Diode 8a, which does not light when the potential at terminal B+ is the same as that at terminal D+, will light when the voltage decreases at terminal D+ because of the resulting voltage drop across resistor 4. The relationship of the values of resistors 4, 5 and 6 is such the Zener diode 10 is nonconductive, so that LED 8b does not light.

Adjusting the values in the circuit of FIG. 3 so that only one of the LED's 8a' and 8b' lights at any one time is somewhat more difficult. In principle, the circuit of FIG. 3 operates in the same manner as that of FIG. 2. LED 8a' will light after switch $Z_S$ is closed because of the voltage drop distribution across resistors 4' and 5'. When the generator is running, the voltage at terminal D+ rises to approximately the potential of terminal B+. This causes LED 8a' to extinguish. A break in the exciter circuit with the drop of voltage at terminal D+ causes lighting of LED 8b'.

The circuit of FIG. 4 differs from that in FIG. 3 in that the series circuit including LED 8b", whose lighting is to indicate a generator overvoltage, is directly connected to terminal B+ when switch $Z_S$ is closed.

Various changes and modifications may be made within the scope of the inventive concepts.

I claim:

1. A malfunction indicator for a vehicle having an electrical system comprising a battery having a positive (B+) and negative (B−) output terminal, switch means (ZS) connected to said positive output terminal, a generator, and voltage regulator means having a regulator input (D+) connected to said generator, comprising
    indicator means (8), for furnishing a visual indication in response to at least a minimum voltage applied thereto, said indicator means having a first terminal connected to said switch means and a second terminal;
    a reference voltage source (10) connected between said second terminal of said indicator means and said negative output terminal of said battery for maintaining said second terminal at said reference voltage, said reference voltage source and said indicator means thereby forming a series circuit;
    voltage divider means (4,5,6) comprising a plurality of series-connected resistors connected in parallel with said series circuit, said voltage divider means having a voltage divider tap (7); and
    means for connecting said voltage divider tap to said regulator input, whereby said indicator means furnishes said visual indication when the voltage at said regulator input and therefore at said voltage divider tap is substantially greater than or substantially less than the normal operating voltage at said regulator input.

2. An electrical system as set forth in claim 1, wherein said indicator means comprises a light-emitting diode; and
wherein said reference voltage source comprises a Zener diode.

3. An electrical system as set forth in claim 2, wherein said voltage divider means comprises a first, second and third resistor (4, 5, 6); and
further comprising a fourth resistor (12) connected between said third resistor and said Zener diode.

4. An electrical system as set forth in claim 2, further comprising a current limiting resistor (9) connected in series with said light-emitting diode.

5. An electrical system as set forth in claim 1, further comprising a diode (3) connected between said switch means and said voltage divider means.

6. An electrical system as set forth in claim 2, wherein said regulator furnishes a regulator output voltage having a predetermined variation with respect to temperature; further comprising means (1) connected in series with said Zener diode for compensating for said temperature variation.

7. An electrical system as set forth in claim 6, wherein said temperature compensating means comprises at least one diode.

8. An electrical system as set forth in claim 1, wherein said indicator means comprises first means (8a) and second means (8b) for furnishing a visual indication when said generator is underexcited and overexcited, respectively.

9. An electrical system as set forth in claim 8, wherein said first and second means comprises, respectively, a first and second light-emitting diode.

10. An electrical system as set forth in claim 9, wherein said first light emitting diode is connected between said switch means and said regulator input terminal, and said second light-emitting diode is connected between said regulator input terminal and said reference voltage source.

11. An electrical system as set forth in claim 10, further comprising a first and second current limiting resistor (9, 16) connected in series with said first and second light emitting diode, respectively.

12. Apparatus as set forth in claim 11, further comprising an additional resistor (14) connected between said second light-emitting diode and said regulator input terminal.

* * * * *